United States Patent [19]

Mesecar et al.

[11] 4,016,407
[45] Apr. 5, 1977

[54] UNIVERSAL MODULAR CONTROLLER

[75] Inventors: Roderick S. Mesecar; Frank G. Evans, both of Corvallis, Oreg.

[73] Assignee: The United States of America as represented by the Secretary of the Navy, Washington, D.C.

[22] Filed: Sept. 19, 1975

[21] Appl. No.: 614,996

[52] U.S. Cl. .............................. 235/92 CT; 58/33; 235/92 T
[51] Int. Cl.² .......................................... G06M 3/00
[58] Field of Search ........ 235/92 CT, 92 T, 92 CC, 235/92 BD; 340/147 P, 147 B, 147 C, 174 SD; 317/137, 138, 139; 58/24 R, 24 A, 33

[56] References Cited
UNITED STATES PATENTS

| 3,391,305 | 7/1968 | Bradwin et al. | 235/92 T |
| 3,445,638 | 5/1969 | Montgomerie | 235/92 CT |
| 3,445,639 | 5/1969 | Martens | 235/92 CT |
| 3,534,398 | 10/1970 | Wajda | 235/92 CT |
| 3,789,195 | 1/1974 | Meier et al. | 235/92 T |
| 3,824,378 | 7/1974 | Johnson et al. | 235/92 CT |
| 3,851,120 | 11/1974 | Crosley | 235/92 T X |

OTHER PUBLICATIONS

Pressman, Design of Transistorized Circuits—, John F. Rider, Inc., 1959 pp. 5-96 to 5-104.

Primary Examiner—Thomas J. Sloyan
Attorney, Agent, or Firm—R. S. Sciascia; Charles D. B. Curry

[57] ABSTRACT

A universal modular controller for controlling remote events over short or long time periods. The controller includes a clock, a counter and one or more decoder and logic networks. The clock may have a pulse rate range of from a few microseconds to more than an hour. The counter preferably includes four counter stages. Each of the decoder and logic networks is connected to the data output of the counter stages and each decoder and logic network includes a programmable switching and logic network. This makes it possible to provide long and short duration continuous signals as well as individual or repeating pulse signals for control of various types of devices or loads. The controller may control one or many devices, in a simple or complex manner and over short or long time periods.

3 Claims, 4 Drawing Figures

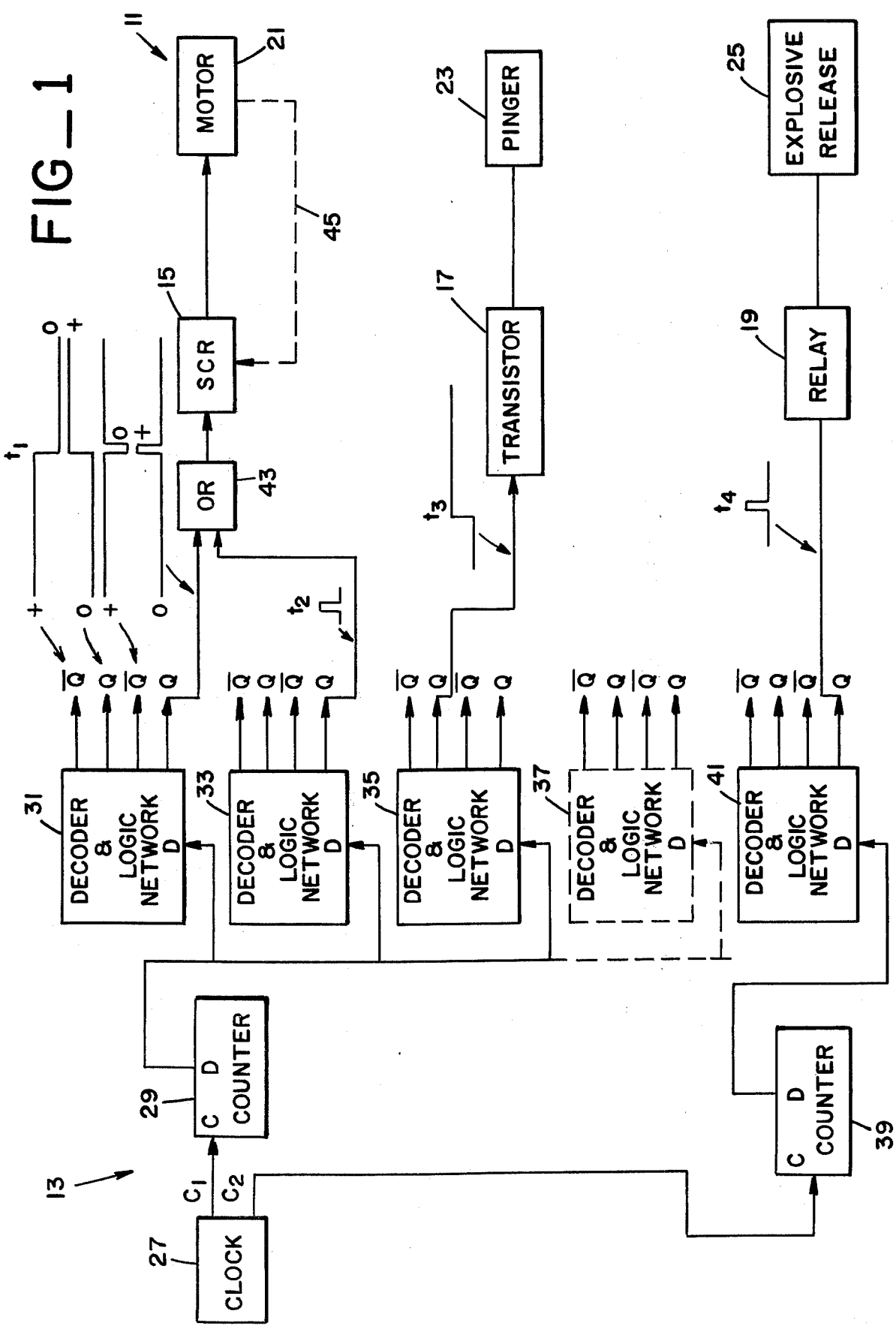

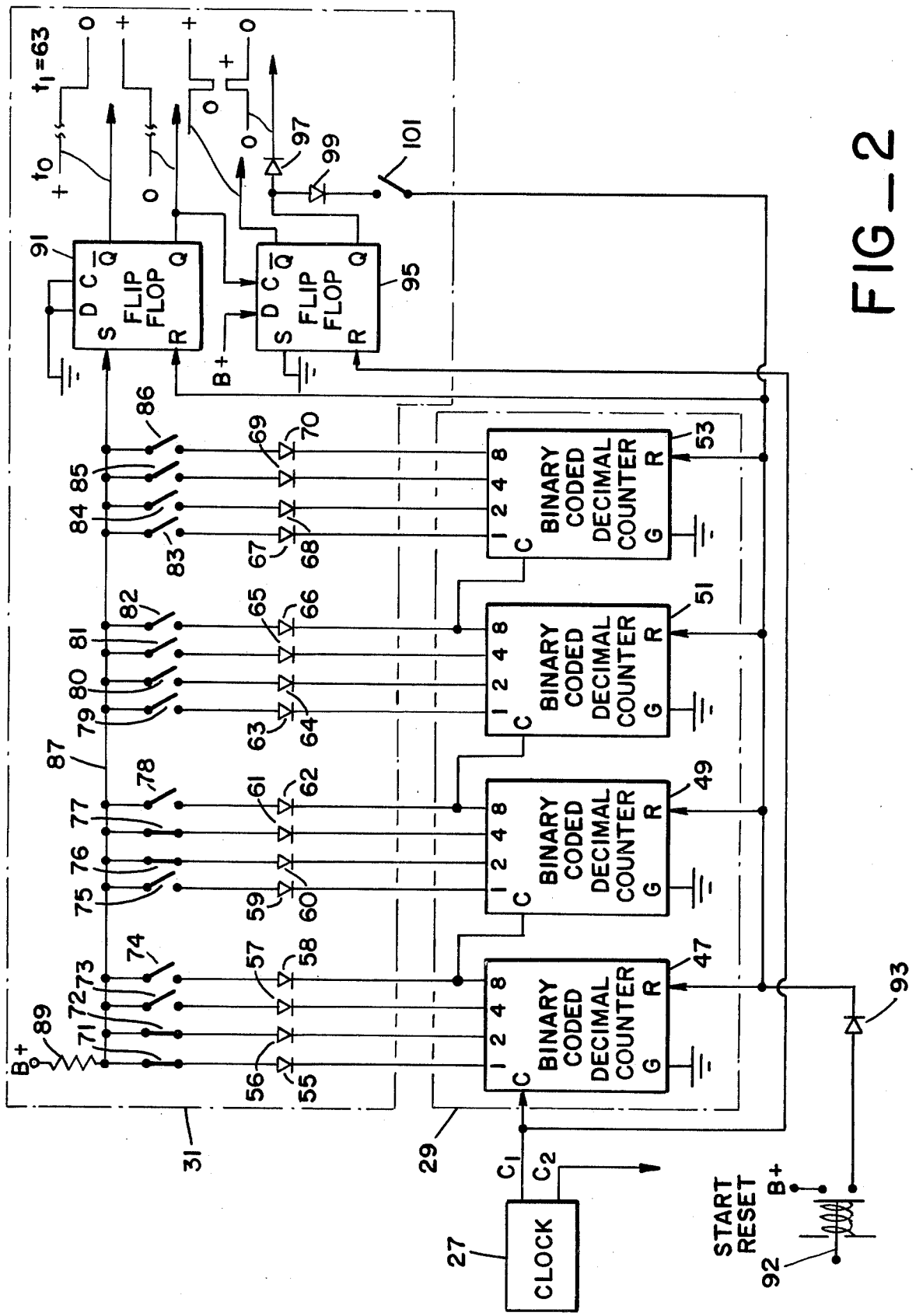
FIG_2

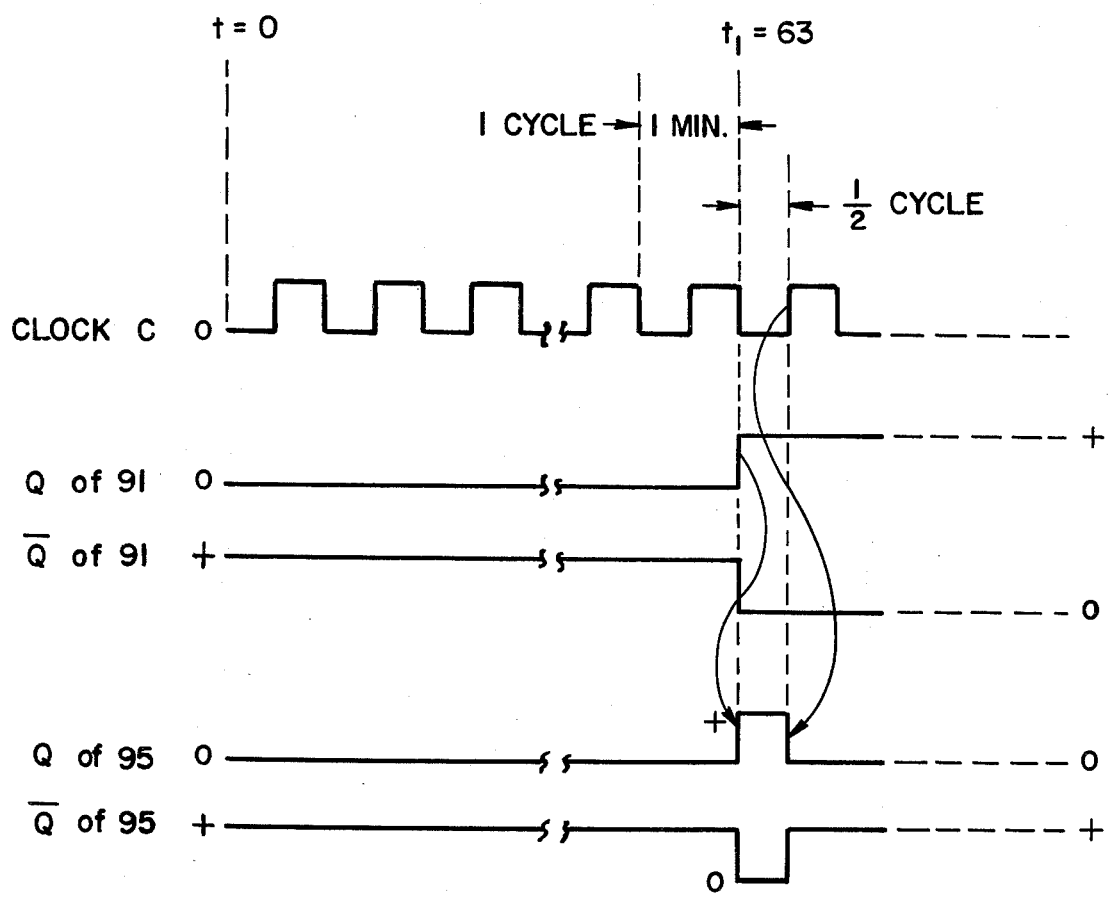
FIG_3
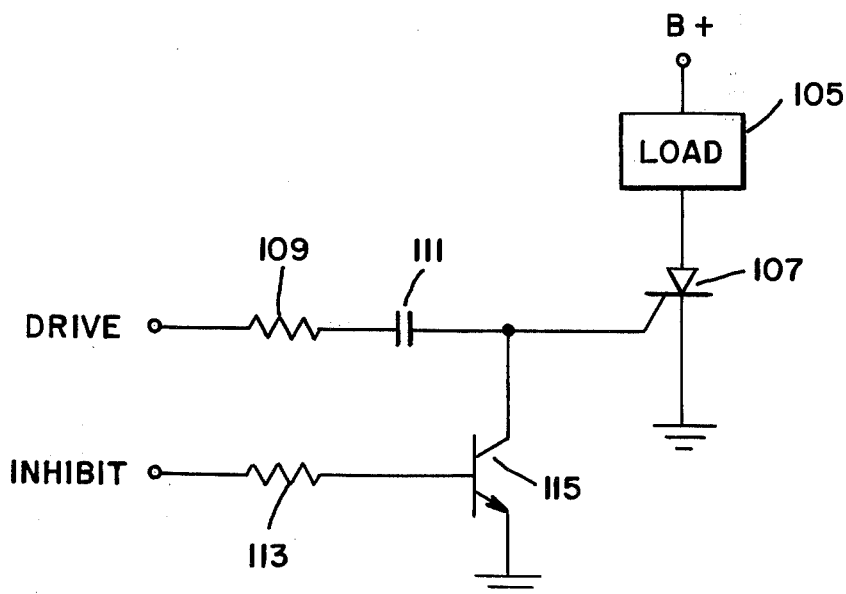
FIG_4

UNIVERSAL MODULAR CONTROLLER

BACKGROUND OF THE INVENTION

1. Field of the Invention

The present invention relates to a controller and more particularly to a universal modular controller that can remotely control a few or many events over short or long time periods.

2. Description of the Prior Art

Prior control systems that have been used to remotely control various types of events of varying complexity have generally been individually designed to perform their specific functions. However, they have not generally had the flexibility of being able to perform new functions without requiring major redesign. Often when a system was redesigned to perform its new function it could be longer perform its original function and therefore two different controllers would be required. This led to very complex and expensive systems with a resulting decrease in performance reliability.

The present invention overcomes these difficulties by providing a universal modular controller that can perform many different complex functions by merely adding more identical decoder and logic network modulars that are individually manually programmable by their switching and logic networks.

SUMMARY OF THE INVENTION

Briefly, the present invention comprises a universal modular controller for controlling remote events over short or long time periods. The controller includes a clock, a counter and one or more decoder and logic networks. The clock may have a pulse rate range of from a few microseconds to more than an hour. The counter preferably includes four counter stages. Each of the decoder and logic networks is connected to the data output of the counter stages and each decoder and logic network includes a programmable switching and logic network. This makes it possible to provide long and short duration continuous signals as well as individual or repeating pulse signals for control of various types of devices or loads. The controller may control one or many devices, in a simple or complex manner and over short or long time periods.

OBJECTS OF THE INVENTION

An object of the present invention is to provide a universal modular controller for controlling the timing of electronic events;

Another object of the present invention is to provide a universal modular controller that is inexpensive and reliable;

Still another object of the present invention is to provide a universal modular controller that can control one or many events;

A further object of the present invention is to provide a universal modular controller that can control events over a very short time span or a very long time span;

A still further object of the present invention is to provide a universal modular controller that can provide a great variety of long or short continuous control signals of positive or negative polarity or single or repeating control pulses at positive or negative polarity at many different time intervals;

A still further object of the present invention is to provide a universal modular controller that can be used to drive motors, circuits, cameras, releases, pingers and the like, which may have high or low DC or AC loads;

A still further object of the present invention is to provide a universal modular controller wherein a plurality of identical decoder and logic networks may be responsive to a single counter and each of the decoders may be readily and manually programmed;

Other objects, advantages and novel features of the present invention will become apparent from the following detailed description of the invention when considered in conjunction with the accompanying drawings wherein:

BRIEF DESCRIPTION OF THE DRAWINGS

FIG. 1 is a schematic diagram of an overall controlling system of which the universal modular controller of the present invention is a part;

FIG. 2 is a schematic diagram of the universal modular controller of the present invention including a counter circuit and a decoder and logic circuit;

FIG. 3 is a timing diagram illustrating the operation of the universal modular controller of FIG. 2; and FIG. 4 is a schematic diagram of a load control circuit that is particularly suitable for use with the universal modular controller of the present invention.

DESCRIPTION OF THE PREFERRED EMBODIMENT

In FIG. 1 is illustrated a schematic diagram of a typical system 11 that may be controlled by the universal modular controller 13 of the present invention. The system 11 being controlled by universal modular controller 13 may include a plurality of controlled or driver elements such as silicon controlled rectifier 15, transistor 17, relay 19 and the like, and a plurality of driven elements such as motor 21, pinger 23, explosive release 25 and the like.

The universal modular controller 13 of the present invention is shown to include a clock 27, counter 29, decoder and logic networks 31, 33 and 35. Decoder and logic network 37 is shown in dotted lines to indicate that any number of additional decoder and logic networks may be employed depending upon the number and timing of additional controlled and driven elements that the system 11 may require. In FIG. 1 the universal modular controller 13 is shown to also include another counter 39 and decoder and logic network 41.

Clock 27 is conventional and may provide a variety of output clock pulses at a plurality of outputs that may vary from microsecond intervals to intervals of an hour or more. For purpose of illustration in the embodiment shown it may be assumed that the pulse intervals of the $C_1$ clock signals are 1 minute and the pulse intervals of the $C_2$ clock signals are one hour. It is to be understood that these timing intervals are given only by way of example and, depending upon the need, any particular clock pulse interval may be employed.

The $C_1$ output of clock 27 is applied to the clock input C of counter 29. The data output D of counter 29 is applied to the data inputs D of the decoder and logic networks 31, 33, 35 and 37. In the example shown only one Q signal, a short pulse, as illustrated by the associated curves in FIG. 1, is used from network 31 and is applied to one input of OR gate 43 the output of which is applied to the input of silicon controlled rectifier 15 which is used to apply power to and drive motor 21. Motor 21 may provide a limit signal, as indicated by dotted line 45, to shut off the power from silicon controlled rectifier 15 when it has completed its desired operational period. The function of decoder and logic network 31 is to select, by proper programming, a predetermined time $t_1$, when motor 21 is to be turned on. The circuit details and operation of decoder and logic network 31 will be hereinafter explained by reference to FIG. 2. It is to be understood that the various other output signals of decoder and logic network 31 may be used to control other devices as may be required.

Network 33 may be programmed to provide a Q signal, a short pulse, that occurs at time $t_2$ which occurs later than time $t_1$. This signal is applied through the other input of OR gate 43 the output of which is applied to the input of driver 15 which is used to apply power to and drive motor 21. As with the above example, motor 21 may again apply a limit signal to shut off the power applied thereto.

Network 35 may be used to provide a Q signal, of long time duration, as illustrated by the associated curves of FIG. 1, that starts at time $t_3$ which occurs later than time $t_2$. This signal may be used to turn on transistor 17 that is used to drive a pinger 23, for example.

The $C_2$ output of clock 27 is applied to the clock input C of counter 39. The data output D of counter 39 is applied to the data input D of network 41. In the example shown only the Q signal, a short pulse, is used from network 41, which is programmed to occur at time $t_4$ which occurs later than time $t_3$. This short pulse signal is applied to the input of relay 19 which may be used to apply power to explosive release 25.

It has been found that the above described universal modular controller 13 has been very satisfactory for oceanographic operations expecially in situations where the controlling and timing of events may take place in periods ranging from a few minutes to a few months. However, it is to be understood that it may be used for any particular operation where a time controlled sequence of events is to take place. It may be used where only one event is to take place, which may require a short or a long signal of positive or negative polarity. In addition, it may be used where a large number of complex events are to take place, which may require both short and long signals of positive or negative polarity. Moreover, it may be used where positive or negative pulses are needed having a short or long time duration between pulses. Furthermore, the events may take place over a very short period of time, for example, a few microseconds (by using a clock providing microsecond pulse periods), or the events may take place over a very long period of time, for example, a few months (as in the above described example). The only limits on the universal modular controller 13 of the present invention are the pulse rate of clock 27, the size or capacity of counter 29, the size or capacity of the decoder section of decoder and logic networks 31, 33, 35, 37 and 41 (the details of which are shown in FIG. 2) and the total number of decoder and logic networks that are used.

It should be particularly noted that only one counter 29 is used to provide the data input to a plurality of individually programmed decoders of decoder and logic networks 31, 33, 35 and 37. It should also be particularly noted that all of the decoder and logic networks are exactly the same. Moreover, if it is desired to add a separate counter and decoder and logic network, to provide greatly extended time durations, such as counter 39 and network 41, they are both identical in construction to the other counter and decoder and logic networks.

In the example of FIG. 1, the system may be used on an underwater sediment sampling system such as shown and described in U.S. Pat. No. 3,975,597 issued Aug. 24, 1976 by Roderick S. Mesecar. In this example, the sediment would be collected for a month, then motor 21 would be turned on a time $t_1$ by network 31. The motor would remain on for a period of about one hour to collect and preserve the sediment. At the end of the hour the motor would turn off by limit signal 45. The sediment would be then collected for another month and then motor 21 would be then turned on at time $t_2$ by network 33. The motor would remain on for another period of about an hour to collect and preserve the sediment at which time the motor would turn off by limit signal 45. After the two sediment samples had been collected then network 35 would provide a continuous signal $t_3$ which would keep pinger 23 in continuous operation. While the pinger was in operation the sediment sampling system could be located by sonar and then grappled and retrieved. If the sediment sampling system could not be located after $t_3$ had been on for a predetermined period of time, such as a few days or weeks, then decoder 41 would provide a signal at time $t_4$ that would actuate explosives release 25 which would release the buoyant sediment sampling system from its anchor and allow it to rise to the ocean surface for a further attempt at retrieval. In this example it would be obviously necessary to select time $t_4$ to occur prior to depleting the internal power supply.

In FIG. 2 are shown the details of the universal modular controller 13 of the present invention. In FIG. 2 are shown the counter 29, contained within the illustrated broken lines, and decoder and logic network 31, contained within another set of broken lines. Only counter 29 and network 31 will be described since all of the other counters and networks that may be used in the universal modular controller 13 of the present invention will be identical.

The $C_1$ output of clock 27 is applied to the clock input C of binary coded decimal counter 47. The last state output, indicated by reference numeral 8 of counter 47, is applied to the clock input C of binary coded decimal counter 49. The last state output, indicated by reference numeral 8 of counter 49, is applied to the clock input C of binary coded decimal counter 51. The last state output, indicated by reference numeral 8 of counter 51, is applied to the clock input C of binary coded decimal counter 53. It should be noted that binary coded decimal counters 47, 49, 51 and 53 are conventional and their operation and construction are well known to those skilled in the art and the details thereof will therefore not be herein described. However, it should be noted that a four stage binary coded decimal counter will generally employ four flip-flop circuits that would normally provide a count of 16 at the time the last stage provided an output. However, these four flip-flop circuits are combined with conventional internal logic to count to 9 and then at the count of 10 all four flip-flop devices would return to 0 and the next counter (having four flip-flop devices) would receive its first clock pulse. Therefore, the first counter 47 provides a 0 to 9 count, the next counter 49 provides an increment of 10 count from 10 to 90, the next counter 51 provides an increment of 100 count from 100 to 900 and the last counter 53 provides an increment of 1,000 count from 1,000 to 9,000. Therefore counters 47, 49, 51 and 53 can together count from 1 to 9,999. The data output of each of the counters 47, 49, 51 and 53 are shown as 1, 2, 4 and 8. From this combination any number from 1 to 9 can be formed by the proper selection of data output signals. For example, the number of 7 is obtained by providing a signal at each of the 1, 2 and 4 (adding to 7) outputs of counter 47. The number 4,359 is obtained by providing signals at the following outputs, the 4 output of counter 53, the 1 and 2 outputs (adding to 3) of counter 51, the 1 and 4 outputs (adding to 5) of counter 49 and the 1 and 8 outputs (adding to 9) of counter 47. All other outputs will be at their 0 or ground states.

The data outputs (which will be 0 or B+) of counters 47, 49, 51 and 53 are applied through diodes 55 through 70 and through switches 71 through 86 as illustrated in FIG. 2. A common bus line 87 is connected to all of switches 71 through 86, to B+ power through resistor 89 and to the set inputs S of flip-flop device 91. The data D and clock C inputs of flip-flop device 91 are grounded.

A start reset signal is applied by switch 92 (which is spring biased to be in the normally open position, as shown) through diode 93 to the reset inputs R of counters 47, 49, 51 and 53 and to the reset input R of flip-flop device 91. When the start reset signal is applied, all of the outputs of all of the counters 47, 49, 51 and 53 go to 0, and the Q output of flip-flop device 91 goes to zero and the Q output goes to a positive (+) state. These conditions are illustrated by the curves associated with the Q and Q outputs of flip-flop device 91. It should be noted that when the start reset signal is applied and removed that the proper Q and Q states normally would be attained. However, if all of switches 71 through 86 were then opened a B+ signal would be applied to the set input S of flip-flop device 91 which would reverse the Q and Q states. This undesirable condition would be maintained even though one or more of switches 71 through 86 were closed and the set input S of flip-flop device 91 were grounded. Therefore, before operation and after switches 71 through 86 have been programmed to provide the desired timing, it is desirable to actuate the start reset switch 92 to assure the Q and Q outputs of flip-flop device 91 are 0 and positive (+) respectively as shown.

The Q output of flip-flop 91 is applied to the clock input C of flip-flop device 95. The data output of flip-flop device 95 is at B+ and the set input S is at zero or ground. The clock output $C_1$ of clock 27 is applied to the reset input R of flip-flop device 95. The Q output of flip-flop device 95 is applied through diode 97 to the device to be actuated and through diode 99 and switch 101 to the reset inputs of counters 47, 49, 51 and 53 and to the reset input of flip-flop 91. It should be noted that this reset functions the same as the start reset and is used, by closing switch 101, when it is desired to have a continuous repetition of cycles by flip-flop devices 91 and 95.

OPERATION

In operation, the timing of the event is selected by the programming of switches 71 through 86. In the FIG. 2 example, switches 71, 72, 76 and 77 are closed and the remaining switches are open. This means that the first event is to take place upon the occurrence of the 63rd (1+2+20+40) pulse from clock signal $C_1$ of clock 27. That is, if the clock pulse intervals are one minute the first event will start 63 minutes after the illustrated programming of switches 71 through 86, the start of clock 27, and actuation of the start reset switch 92 (which also may start clock 27). During the first 62 clock pulses one of the 1 or 2 data outputs of counter 47 or one of the 2 or 4 data outputs of counter 49 will be at ground. Therefore, the associated diode will not be back biased by a B+ data signal and the set input S of flip-flop 91 will be grounded through either counter 47 or counter 49. However, upon the occurrence of the 63rd clock pulse (63 minutes) then all of diodes 55, 56, 60 and 61 will be back biased by the B+ data output signals. Therefore, the set input S of flip-flop 91 will receive a B+ signal and the Q and Q outputs of flip-flop device 91 will reverse states. This condition is shown in FIGS. 2 and 3. As indicated by the curved lines of FIG. 3, it should also be noted that the leading edge of the Q signal of flip-flop device 91 will cause the Q output of flip-flop device 95 to go from 0 to a positive (+) state. It will continue in that state until the next leading edge of the $C_1$ signal from clock 27 is applied to the reset input R of flip-flop device 95. From this it can be seen that at time $t_1$ the Q output of flip-flop device 95 will provide a pulse of one half cycle time duration. It should be noted that if switch 101 is closed that the Q pulse of flip-flop device 95 at time $t_1$ will also reset flip-flop device 91 so that the cycle will be repeated.

It should be noted that these Q and Q positive and negative signals and pulses from flip-flop devices 91 and 95 respectively may be used for a large variety of purposes. For example, in FIG. 4 is shown a control circuit particularly useful as a part of the present invention. That is, B+ power is connected through the load 105 and silicon controlled rectifiers 107 to ground. The DRIVE input may be obtained, for example, from the Q output of flip-flop device 95. That is, at time $t_1$ the Q pulse from flip-flop device 95 would be applied through resistor 109 and capacitor 111 to the gate of silicon controlled rectifier 107. Therefore, silicon controlled rectifier 107 would remain on and the load would be continuously driven until B+ power was removed. However, in certain instances it may be desirable to inhibit the DRIVE pulse and prevent actuation of the silicon controlled rectifier 107 and from applying B+ power to the load. This is achieved by applying a signal to the INHIBIT input that is coincident with the DRIVE pulse that you want to inhibit. The inhibit signal is applied through resistor 113 to the base transistor 115. Therefore, the drive pulse is shunted to ground when it is coincident with the inhibit signal and the silicon controlled rectifier 107 is not turned on. There may be times when it is desirable to inhibit the drive pulse for one or many cycles of occurrence of the drive pulse. The inhibit signal may be obtained, for example, from the Q output of flip-flop device 91 of FIG. 2 that is in one of decoder and logic networks 31, 33, 35, 37 or 41 of FIG. 1.

In view of the foregoing, it can be seen that the universal modular controller 13 of the present invention can very simply perform virtually all electronic timing control functions that may be required. That is, virtually all electronic timing control functions are normally performed by short pulses of positive or negative polarity that occur at preselected times or by long time duration signals of positive or negative polarity that start at a predetermined time and stop at a predetermined time or remain on. The present invention achieves all these operations.

What is claimed is:

1. A controller device comprising:
   a. a clock device:
   b. a counter device having a clock input and a data output;
   c. the output of said clock device connected to the clock input of said counter device;
   d. at least one decoder and logic network including a decoder and a logic network;
   e. the data output of said counter device connected to said decoder of said decoder and logic network;
   f. said decoder including decoding means for preselecting a coding to be decoded;
   g. the output of said decoder connected to the input of said logic network of said decoder and logic network;
   h. the output of said logic network providing at least one control signal when the data output of said counter device corresponds with the preselected coding of said decoder of said decoder and logic network;
   i. said decoder comprising a plurality of diodes and a plurality of switches;
   j. said data output of said counter device comprising a plurality of data output elements;
   k. a decoder element comprising a switch, a diode and a data output element being connected in series;
   l. said plurality of switches, said plurality of diodes and said plurality of data output elements together forming a plurality of decoder elements that are connected in parallel to a common bus line;
   m. one end of said common bus line being connected to the input of said logic network;
   n. said logic network of said decoder and logic network includes first and second flip-flop devices;
   o. said one end of said common bus line is connected to the set input of said first flip-flop device;
   p. one of the data outputs of said first flip-flop device being connected to the clock input of said second flip-flop device;
   q. a start reset means;
   r. the output of said start reset means connected to the reset input of said counter and to the reset input of said first flip-flop device; and
   s. whereby, when said logic network provides said at least one control signal said first flip-flop device simultaneously provides a leading edge ongoing signal at one of the data outputs and a trailing edge offgoing signal at the other data output and said second flip-flop device simultaneously provides positive and negative going pulses at its data outputs simultaneously with and in response to the leading edge of said ongoing signal of said first flip-flop device.

2. The device of claim 1 wherein:
   a. the data output of said second flip-flop device is connected in series through a diode and a switch to said reset input of said counter and to said reset inputs of said first flip-flop device.

3. The device of claim 2 wherein:
   a. the clock and data inputs of said first flip-flop device are connected to ground; and
   b. the set input of said second flip-flop device is connected to ground.

* * * * *